US006257365B1

(12) United States Patent
Hulsebus, II

(10) Patent No.: US 6,257,365 B1
(45) Date of Patent: Jul. 10, 2001

(54) CONE REFLECTOR/COUPLER SPEAKER SYSTEM AND METHOD

(75) Inventor: Alan Dwight Hulsebus, II, Excelsior, MN (US)

(73) Assignee: Mediaphile AV Technologies, Inc., Plymouth, MN (US)

( * ) Notice: Subject to any disclaimer, the term of this patent is extended or adjusted under 35 U.S.C. 154(b) by 0 days.

(21) Appl. No.: 08/705,671

(22) Filed: Aug. 30, 1996

(51) Int. Cl.[7] .............................. H05K 5/00; A47B 81/06

(52) U.S. Cl. ............................................ 181/155; 181/199

(58) Field of Search .................................... 181/141, 144, 181/155, 156, 199; 381/153, 160

(56) References Cited

U.S. PATENT DOCUMENTS

| | | | | |
|---|---|---|---|---|
| 2,096,192 | | 10/1937 | Moore | 181/31 |
| 3,326,321 | * | 6/1967 | Valuch | 181/144 |
| 3,668,335 | * | 6/1972 | Beveridge | 381/159 |

(List continued on next page.)

FOREIGN PATENT DOCUMENTS

| | | |
|---|---|---|
| 411165 | 10/1935 | (BE) . |
| 1192259 | 5/1965 | (DE) . |
| 0605224 | 7/1994 | (EP) . |
| 404037 | 1/1934 | (GB) . |
| 2195218 | 3/1988 | (GB) . |
| 2-218295 | 8/1990 | (JP) . |
| 2-237296 | 9/1990 | (JP) . |
| 2-291798 | 12/1990 | (JP) . |
| 61-264897 | 11/1996 | (JP) . |
| WO90/07103 | 6/1990 | (WO) . |

OTHER PUBLICATIONS

"Copy of PCT Search Report dated Apr. 6, 1997 by R. DeBekker for Application No. PCT/US97/–1334", 3 pages.

Glyn Adams, "Time Dependence of Loudspeaker Power Output in Small Rooms," *Loudspeakers*, vol. 4, 1996, Journal of the Audio Enginering Society, pp. 414–442, Mar. 1988.

Floyd E. Toole, "Loudspeaker Measurements and Their Relationship to Listener Preferences: Part 1," *Loudspeakers*, vol. 4, 1996, Journal of the Audio Engineering Society, pp. 357–382, May 1985.

Floyd E. Toole, "Loudspeaker Measurements and Their Relationship to Listener Preferences: Part 2," *Loudspeakers*, vol. 4, 1996, Journal of the Audio Engineering Society, pp. 336–344, May 1985.

Floyd E. Toole, "Subjective Measurements of Loudspeaker Sound Quality and Listener Performance," *Loudspeakers*, vol. 4, 1996, Journal of the Audio Engineering Society, pp. 276–303, Mar. 1984.

D.J. Verschuur, et al., "Wigner Representation of Loudspeaker Responses in a Living Room," *Loudspeakers*, vol. 4, 1996, Journal of the Audio Engineering Society, pp. 383–392, Mar. 1987.

*Primary Examiner*—David M. Gray
(74) *Attorney, Agent, or Firm*—Schwegman, Lundberg, Woessner & Kluth, P.A.

(57) ABSTRACT

A speaker system including a cone reflector connected to a speaker driver. The cone reflector has at least one included angle used to reflect sound in a desired pattern in the horizontal and vertical planes. Where the sound in dispersed in the vertical plane is a function of the included angles. These angles may be varied or more included angles may be added to achieve certain sound energy distributions. The speaker driver is located above the cone reflector with the narrower end of the cone facing the output of the speaker driver. Sound generated by the speaker driver is reflected off the cone reflector and dispersed as a function of the included angles of the cone reflector.

19 Claims, 15 Drawing Sheets

U.S. PATENT DOCUMENTS

| | | | | |
|---|---|---|---|---|
| 3,735,336 | * | 5/1973 | Long | 367/150 |
| 3,773,976 | * | 11/1973 | Beveridge | 381/90 |
| 3,778,562 | * | 12/1973 | Wright | 381/159 |
| 3,935,925 | * | 2/1976 | Koiwa et al. | 181/192 |
| 4,134,471 | | 1/1979 | Queen | 181/147 |
| 4,219,705 | * | 8/1980 | Hill | 381/111 |
| 4,227,050 | * | 10/1980 | Wilson | 181/144 |
| 4,348,549 | * | 9/1982 | Berlant | 181/153 |
| 4,434,507 | * | 2/1984 | Thomas | 381/153 |
| 4,450,929 | * | 5/1984 | Marrs | 181/146 |
| 4,553,628 | * | 11/1985 | Nakamura | 181/145 |
| 4,625,829 | * | 12/1986 | Sirois | 181/175 |
| 4,800,983 | * | 1/1989 | Geren | 181/155 |
| 4,870,691 | * | 9/1989 | Mindel | 381/159 |
| 4,876,723 | * | 10/1989 | Fang | 181/144 |
| 4,907,671 | * | 3/1990 | Wiley | 181/156 |
| 4,949,386 | * | 8/1990 | Hill | 381/188 |
| 5,081,683 | * | 1/1992 | Torgeson | 381/203 |
| 5,115,882 | | 5/1992 | Woody | 181/144 |
| 5,117,463 | * | 5/1992 | Oyaba et al. | 381/158 |
| 5,129,006 | * | 7/1992 | Hill et al. | 381/100 |
| 5,144,670 | * | 9/1992 | Negishi | 181/153 |
| 5,173,942 | | 12/1992 | Hirose | 381/89 |
| 5,229,555 | * | 7/1993 | Inoue et al. | 181/146 |
| 5,306,880 | * | 4/1994 | Coziar et al. | 181/149 |
| 5,402,502 | * | 3/1995 | Boothroyd et al. | 181/155 |
| 5,418,336 | * | 5/1995 | Negishi et al. | 181/155 |
| 5,616,892 | * | 4/1997 | Ferralli | 181/155 |

* cited by examiner

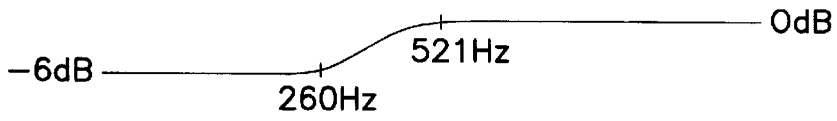
FIG. 17
FIG. 18
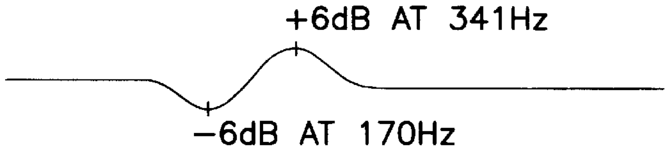
FIG. 19
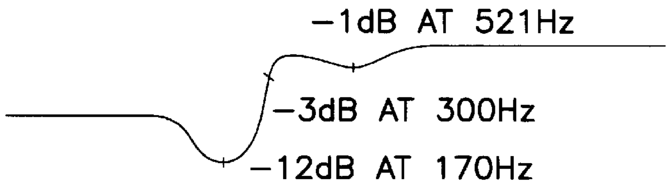
FIG. 20
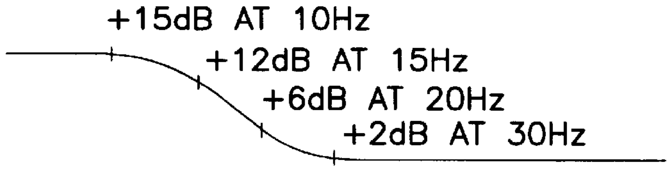
FIG. 21
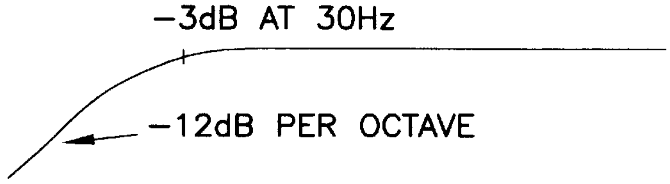
FIG. 22
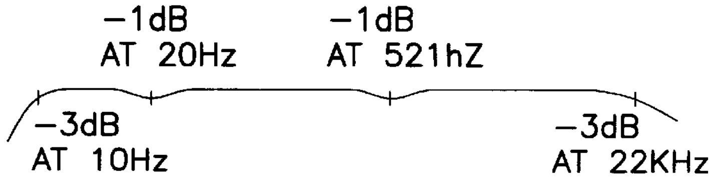

CONE REFLECTOR/COUPLER SPEAKER SYSTEM AND METHOD

BACKGROUND OF THE INVENTION

1. Field of the Invention

The present invention relates to devices for transmitting sound, specifically to speaker systems that utilize a cone reflector to reflect sound waves in a pattern resulting from the shape of the cone reflector.

2. Background Information

All speakers have a roll off in their frequency response as the speaker cabinet face becomes small relative to the wavelength of the sound being produced. This roll off of radiation efficiency is called diffraction loss. Diffraction loss adversely effects the low end frequency response of the speakers, leaving them sounding tinny. The higher sounds, having smaller wavelengths, are louder than lower sounds.

The transition frequency for diffraction loss occurs at a frequency whose one half wavelength occurs at the shortest width of the cabinet face. Above the transition frequency the speaker driver radiates as a hemisphere or 2 pi radians. Below the transition frequency the speaker driver radiates as a full sphere or 4 pi radians. The difference between these two different radiation patterns is 6 decibel of frontal lobe directivity gain for hemispherical radiation above the transition frequency. The cabinet face can be thought of as a 180 degree horn with the cutoff frequency at the width of the cabinet face. The total sound power into the room is the same above and below the transition frequency. Therefore, the problem exists that on axis frequency response is very different from off axis frequency response. This would occur even if the speaker driver was perfect. Real voices, instruments and microphones do not have this problem because they are acoustically small relative to the frequencies they produce or measure.

A conventional mini speaker may have a cabinet face dimension of 4 inches by 8 inches. These dimensions correspond to one half wavelength frequencies of 1695 Hertz and 847 Hertz. This results in a 6 decibel frequency step right in the middle of the voice and most instruments.

The diffraction loss effect could be corrected in a conventional speaker by adding 6 dB of electronic equalization. However, 6 dB of boost requires four times the amplifier power. In addition, a 6 dB boost would require a doubling of speaker diaphragm travel which would also raise Frequency Modulation Distortion by 6 dB. Other 2nd and 3rd harmonic distortions related to nonlinear BL product versus voice coil position would also be created. There would also be some power compression resulting in speaker parameter and frequency response changes. The cone area could be doubled to bring the diaphragm travel back to unity, but the extra mass would reduce height frequency extension and the larger diameter would make high frequencies more directional.

Another problem with conventional speakers is near field reflection. Near field reflection introduces distortion due to the small amount of delay time in the reflected sound. In research by Don Davis it is suggested that the minimum reflection time delay should be 10 msec (or approximately 8.85 feet path length) to avoid imaging problems. In a conventional speaker system a tweeter, or high frequency radiator, will be mounted some distance above the surface the speaker system is sitting on. When listening to the speaker there are two arrival times for the sound coming from the tweeter. The first arrival time is from the direct radiation of the tweeter to the ear and the second arrival time is from the reflection of the tweeter sound from the surface the speaker system is sitting on. The short delay time of the reflected sound causes "time smearing" of high frequencies which significantly reduces intelligibility and imaging of the sound. In addition, there is a dip in the frequency response due to the reflected wave being out of phase with the direct radiated wave. If a tweeter were 6 inches above a table top, with the listening ear 15 inches above the table top and 24 inches away from the speaker there will be an audible depression in the frequency response of the speaker centering around 1970 Hz. This corresponds to a difference in path length of 6.9894 inches resulting in a time delay of 515 micro-seconds.

An additional source of distortion occurs with ceiling mounted speakers when reflections of the sound waves arrive at the ear as a mono signal. Ceiling speakers have a relatively short time delay between the direct radiation from the ceiling and the reflected radiation from a desk top. Path length differences of 30 inches result in a 2190 micro-second delay which yields a frequency depression around 452 Hz. This tends to blur consonants of speech thereby reducing intelligibility.

There are two schools of thought on how to control the audibility of reflections. The first and most widely used in recording studios is the LEDE or Live End Dead End. This approach uses directional horn speakers with extensive room acoustic treatment. A second approach, which has been pursued for home reproduction, uses the principle of multiple diffuse reflections to mask and prevent any singular or speaker-based loud reflections from becoming clearly audible.

Basically six methods of achieving multiple diffuse reflections exist in the marketplace. The most widely known of the techniques is the BOSE approach. In the BOSE system discrete drivers are pointed in different directions. Although the result approximates uniform dispersion, due to its discrete nature the radiation pattern of these speakers is not continuous over 360 degrees. There is, therefore, severe comb filtering effects in the horizontal plane due to the individual drivers interacting. Further, the multiple drivers used do not maintain time alignment across the frequency band. This also disrupts the frequency balance and imaging through the crossover region. The reflected frequency balance can therefore be so distorted that conventional speakers will usually sound better than these designs.

The second most widely known technique is the Di-Polar approach used in electrostatic and ribbon speakers like Magnaplaner. This design uses the speakers without a rear enclosure or "open back". This design cancels all sound radiation to the sides, and rear sound is out of phase with the front sound. At low frequencies this cancellation drops the bass volume below perceptibility. Traditionally wide diaphragms are used. These types of diaphragms have high directivity change versus frequency. Thus, this radiation pattern does not create diffuse room reflections with even frequency balance. There is only one reflection off the back wall so it fails to mask room echoes. Di-Polar speakers also require ten times the air volume displacement of a box speaker for a given loudness due to the front/rear cancellations. They must therefore be very large to get significant volume output.

The third most widely known technique is Bi-Polar radiation. This approach is essentially placing two conventional speakers back to back with specific crossover changes. The design was first popularized by Mirage based on research by the Canadian National Research Council. Multiple drivers are placed on the front and back of the cabinet and operated in phase. The multiple diaphragms and shape of the cabinets cause very nonlinear frequency balance to the sides of the speakers. The rear speakers direct path sound wraps around the cabinet and combines with the front sound. The result is a large bump in frequency balance. The vertical offset of the drivers also causes vertical lobing error problems.

The fourth most widely known approach uses a reflector cone of some geometry. Reflector cones to date have been designed with curved sides used to encourage laminar air flow and to disperse the sound in the vertical plane. With traditional types of cone geometry approximately 25 percent of the sound is reflected back into the speaker. In addition, since the curved upper cone geometry includes included angles of less than 90 degrees in most designs, high frequency energy is directed below the speaker's horizontal plane. This results in secondary near field reflections. If the curved upper cone geometry includes curves of too small a diameter having included angles of greater than 90 degrees sounds are directed back into the speaker creating secondary reflections with severe frequency modulation distortion and comb filtering.

In addition, the curved reflector cones tend to reflect too much energy toward the ceiling. For instance, if the curved reflector cone includes included angles of greater than 135 degrees, energy is directed at an angle greater than 45 degrees above the horizontal plane. The energy at this angle tends to reflect off the ceiling before being heard by the listener, creating a reflection problem. In addition, the curved surface causes multiple phase delays in the high frequency which smears the transient response degrading high frequency output and reducing imaging.

The fifth type of 360 degree radiation speaker uses the rear radiation of a very special full range speaker driver constructed with its reflector cone having a very narrow included angle of only 45 degrees. This is the famous Lincoln Walsh design manufactured by OHM acoustics. This floor standing system mounts the driver on top of a box at ear level with the front of the driver facing down into the box. The listener listens to the back side of the moving speaker cone which sends sound 360 degrees in the horizontal plane except for high frequency which is absorbed in the rear 180 degrees with acoustic treatment. This design has some diffraction loss but its diffraction loss is partially compensated by the reduced high frequency efficiency of the full range driver. Less expensive designs by OHM use one separate conventional dome tweeter facing forward crossing over to a conventional bass/midrange driver placed in the Walsh configuration. In this two driver arrangement the directivity above and below the crossover is radically different.

The sixth type of 360 degree radiation speaker consists of pulsating cylinders stacked one above the other like in the German MBL speakers. They do have 360 degree radiation with identical frequency and volume. However, the vertical offset of the treble, midrange and bass drivers does cause significant horizontal lobing errors in the frequency response. There is also diffraction loss in this design.

It is clear that the speaker designs used to date do not overcome the above problems to provide identical frequency balance and volume in all directions of the horizontal plane. What is needed is a system and method of radiating sound energy uniformly and with identical frequency balance in all directions of the horizontal plane.

SUMMARY OF THE INVENTION

In one aspect of the present invention, a speaker system includes a cone reflector connected to a speaker driver. The cone reflector has at least one included angle used to reflect sound in a desired pattern in the horizontal and vertical planes. Where the sound is dispersed in the vertical plane is a function of the included angles. These angles may be varied or more included angles may be added to achieve certain sound energy distributions. The speaker driver is located above the cone reflector with the narrower end of the cone facing the output of the speaker driver. Sound generated by the speaker driver is reflected off the cone reflector and dispersed as a function of the included angles of the cone reflector.

According to another aspect of the present invention, the cone reflector may be placed on a table top or adjacent to another flat surface (such as a wall) in order to lessen diffraction loss and thus deepen the sound of the speakers.

According to yet another aspect of the present invention, the cone reflector may be designed to distribute sound in an optimal way to a predefined listening height. In one such approach, the cone reflector includes a portion of a cone with at least one included angle. A speaker driver is placed so that it may direct energy at the cone, the narrower end of the cone being closest to the speaker driver. The unit may be placed on a flat surface such as a wall or a table top, thus coupling the system and lessening the diffraction loss allowing the speaker to sound deeper. A bass speaker may be added to augment very low frequency sound.

According to yet another aspect of the present invention the cone reflector is designed to reflect sound in certain predefined directions.

BRIEF DESCRIPTION OF THE DRAWINGS

In the accompanying drawings in which several of the preferred embodiments of the invention are illustrated:

FIGS. 17–22 are plots of frequency response across the audio bandwidth for various aspects of the cone reflector speaker system.

DETAILED DESCRIPTION OF THE PREFERRED EMBODIMENTS

In the following Detailed Description of the Preferred Embodiments, reference is made to the accompanying Drawings which form a part hereof, and in which are shown by way of illustration specific embodiments in which the invention may be practiced. It is to be understood that other embodiments may be utilized and structural changes may be made without departing from the scope of the present invention.

As previously discussed there are many deficiencies in conventional speakers that could be improved to give a better sound. This can be done by reducing near field reflections and diffraction loss, or by designing the speaker for optimized horizontal dispersion and controlled vertical dispersion. Real voices and instruments have 360 degree radiation patterns and project the same frequency balance and volume directly at the listener as well as bounce it off the walls of the room. Over the last 15 years there has been several psychoacoustic studies published on how the frequency versus directivity of a speaker affects perceived sound quality and speech intelligibility. This is important because the brain integrates the sound received from all directions, direct plus all wall reflections, to determine what it is hearing and where it is. The human brain learns the sound of real live voices and thus tries to fit the sounds of a speaker into this learned model. The speaker can only sound real if it makes sounds in a room in an identical manner to the original source of sound. The ultimate speaker, then, should have an identical frequency balance in all directions. However directionality, measured as sound volume for on axis versus off axis response is still hotly debated. The general consensus is that the larger the room the more directional a speaker should be to control reverberant energy and echoes, i.e. use narrow horns in auditoriums. Research by Floyd E. Toole of the Canadian National Research Council suggests that in a small home living room directivity should be as wide as possible for the most natural sound. A small room does not have reverberation and the echoes can be masked by having a broad and even sound dispersion.

Figure 1:
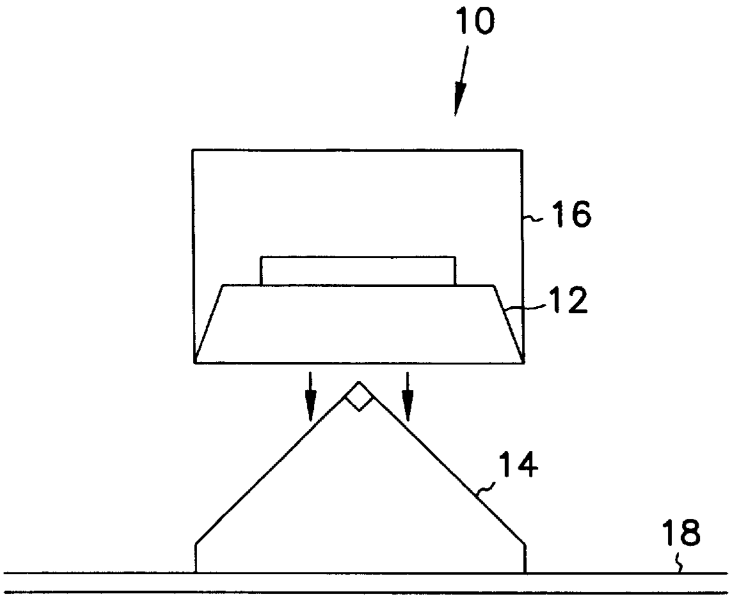
FIG. 1 is a side view of one embodiment of a cone reflector/coupler table top speaker system.

A speaker system which exhibits this type of broad and even sound dispersion is shown in FIG. 1. In FIG. 1, a speaker 10 includes a speaker driver 12, a cone reflector/coupler 14 and a cabinet 16. Speaker driver 12 is mounted in cabinet 16; cabinet 16 is then mechanically connected to cone reflector/coupler 14 such that sound waves generated by speaker driver 12 are reflected off of cone reflector/coupler 14. In one embodiment cone reflector/coupler 14 is placed approximately perpendicular to the face of speaker driver 12 so as to radiate sound evenly over 360 degrees of the horizontal plane. In another embodiment, cone reflector/coupler 14 is placed skewed from perpendicular in order to direct sound in a desired pattern.

In the embodiment shown in FIG. 1, speaker 10 uses a flat surface 18 such as a table or a desk top as the apparent cabinet face. An average desk top measures 32 inches by 72 inches. These dimensions correspond to one half wavelength frequencies of 212 Hertz and 94 Hertz. This is near the bottom of the voice and most instruments resulting in a flat acoustic frequency response across the entire voice range. The minus 6 decibel frequency occurs at 106 Hertz and is below the crossover transition frequency from the miniature desktop speaker to a subwoofer 17. In a good crossover network 15 one would accommodate this frequency transition into the design and make it seamless. Thus, adequate low end sound could be heard even with small speakers in the present invention. The efficacy of the coupling to the desk top can be demonstrated by lifting speaker 10 off the table or desk top. A dramatic decrease in the lower frequency audio will be heard when the system is lifted off the table surface. None of the cone designs discussed in the Background of the Invention above are designed to couple lower frequencies to a surface plane to lower the frequency of diffraction loss.

Use of the table top as the apparent speaker cabinet provides fuller sound while using the same amplifier power. The reason for this is that the table top reinforces the low end frequencies, extending the lower end of the frequency response of the speakers and reducing the frequency range which must be augmented with a bass speaker. In operation, the 2 pi radians radiation pattern is maintained to the shortest dimension of the table top, thus moving the diffraction loss step to a lower frequency that is beneath the vocal range and below a crossover frequency to a separate subwoofer.

As noted above, amplifier power would have to be increased four fold to achieve the same results with a conventional speaker By coupling to the table top, speaker 10 achieves similar results with 10 watts that could be achieved with a conventional speaker being driven with 40 watts of power.

In one embodiment, such as is shown in FIG. 1, speaker 10 provides 360 degree radiation of sound waves, providing nearly identical frequency balance and volume in all directions of the horizontal plane. The specific geometry chosen for cone reflector/coupler 14 and the use of cone reflector/coupler 14 with a full range or coincident speaker driver 12 makes this possible. In the embodiment shown in FIG. 1, cone reflector/coupler 14 is a cone having an included angle of 90 degrees. Such a cone geometry will tend to reflect sound along the top of the table or desk top. A polar plot of sound dispersion from speaker 10 in FIG. 1 is shown in FIG. 2.

Figure 2:
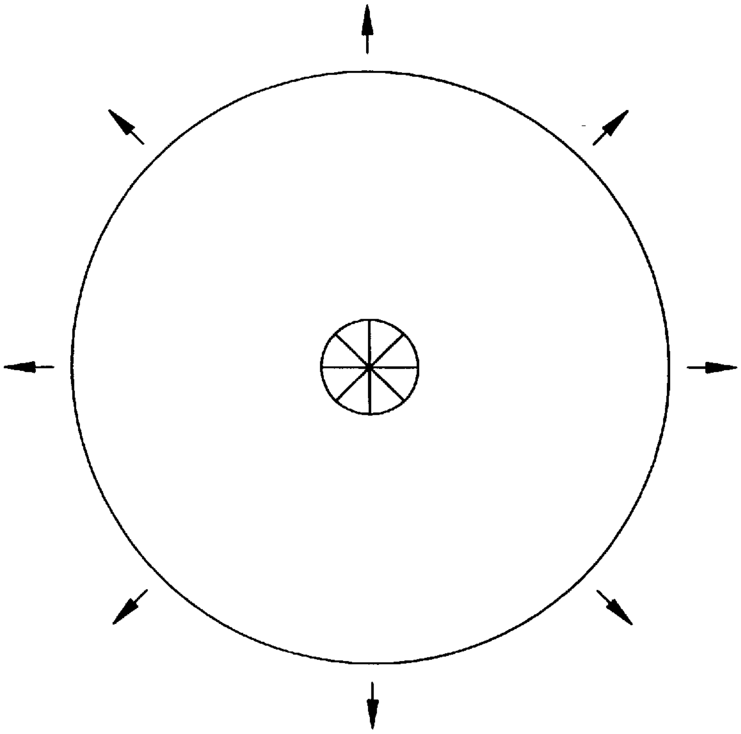
FIG. 2 is a top view of the reflector cone/coupler speaker table top system showing the 360 degree radiation pattern.

In contrast to the plot shown in FIG. 2, conventional speakers have a very irregular frequency response versus direction due to the use of separate multiple sized drivers used to reproduce different frequency bands. The off axis frequency response is further compromised due to vertical offset of these drivers and the resulting interference patterns, or lobing errors, that occur in the crossover region between them. Wavelength versus diaphragm size is different for every frequency causing directivity to be different at every frequency. This is especially a problem at the crossover frequency where there is typically an acoustically very large diaphragm below the crossover and an acoustically very small diaphragm above the crossover.

In the Cone Reflector/Coupler speaker shown in FIG. 1 all these errors are isolated in the vertical plane where your ears are significantly less sensitive and the room returns less reflected energy. A full range or coincident speaker driver is used so there are no vertical lobing errors around crossover frequencies. The vertical frequency errors consist solely of a smooth roll off of high frequency response as you move away from the horizontal to 90 degrees up or down. The cone profile and enclosure diameter determine the high frequency vertical dispersion. Their dimensions and geometry can be adjusted to focus high frequency as required for specific applications.

In addition, in contrast to the conventional speaker driver in a speaker such as speaker 10 of FIG. 1 the table top is used to the advantage of speaker 10. In a conventional speaker system a tweeter, or high frequency radiator, will be mounted some distance above the surface the speaker system is sitting on. When listening to the speaker there are two arrival times for the sound coming from the tweeter. The first arrival time is from the direct radiation of the tweeter to the ear and the second arrival time is from the reflection of the tweeter sound from the surface the speaker system is sitting on. The short delay time of the reflected sound causes "time smearing" of high frequencies which significantly reduces intelligibility and "imaging" of the sound. In addition, there is a dip in the frequency response due to the reflected wave being out of phase with the direct radiated wave. If a tweeter were 6" above a table top with, the listening ear 15" above the table top and 24" away from the speaker there will be an audible depression in the frequency response of the speaker centering around 1970 Hz. This corresponds to a difference in path length of 6.9894 inches resulting in a time delay of 515 micro-seconds.

With the reflector cone design speaker shown in FIG. 1 all sound is first reflected off cone reflector/coupler 14 which is on the desk top surface. There is only one possible path for sound to take to get to the ear.

Finally, with speaker 10 of FIG. 1 reflections off the walls of the room have a relatively long time delay and are very diffuse due to the multitude of path lengths and directions. This combination creates a very large sound stage that does not appear to have boundaries like conventional speakers. The well diffused time delayed sounds bring the music performers "inside the room with you" rather than "over there by the wall" like conventional speakers. There is a great sense of "ambiance" as the original recorded venue clearly comes through the listening room acoustics.

The 360 degree dispersion of speaker 10 can be used to advantage for certain applications. For example, when conventional speakers are used in conference rooms, they typically must be placed at one end of the room in order to take advantage of the directionality of the speakers. In contrast, since speaker 10 exhibits nearly identical frequency balance and volume in all directions of the horizontal plane, speaker 10 can be placed in the middle of the table instead of at one end and all of the people seated around the table will have identical loudness and frequency balance. Furthermore, since speakers 10 as positioned are closer on average to the listeners their volume can be about 3 decibel lower (which represents one half the amplifier power for a given volume at the listeners ears). This results in significantly increased intelligibility of the presentation. Conventional speakers would have a 12 decibel error in frequency and volume in this application.

Cone Reflector/Coupler speakers such as speaker 10 can also be used to replace ceiling mounted speakers. Speakers which are mounted in a ceiling exhibit reflections which arrive at the ear as a mono signal. This is the big advantage speaker 10 has over ceiling mounted speakers. Ceiling speakers have a relatively short time delay between the direct radiation from the ceiling and the reflected radiation from a desk top. Path length differences of 30 inches results in a 2190 micro-second delay which yields a frequency depression around 452 Hz. This tends to blur consonants of speech thereby reducing intelligibility.

Cone reflector/coupler speaker 10 has its reflection greatly delayed and damped compared to the ceiling speaker. The path length to the ceiling and then the ear is approximately 132 inches. This results in a time delay of 9636 micro-seconds yielding a sound depression centering around 102 Hz. This is well below the voice coming out of a small desk top speaker (it should have crossed over to a floor mounted subwoofer by 100 to 150 Hz anyway).

In addition, by controlling vertical directivity of the reflector via the cone reflector/coupler profile, one can make sure that sound radiated toward the ceiling is attenuated several dB relative to sound in the on axis "sweet spot" defined by the cone's geometry. Finally, in most situations any sound reflecting off of the ceiling is further attenuated relative to the direct radiation by acoustic damping treatments applied to the standard ceiling while desk tops such as desk top 18 have no such acoustic damping treatment.

Figure 3:
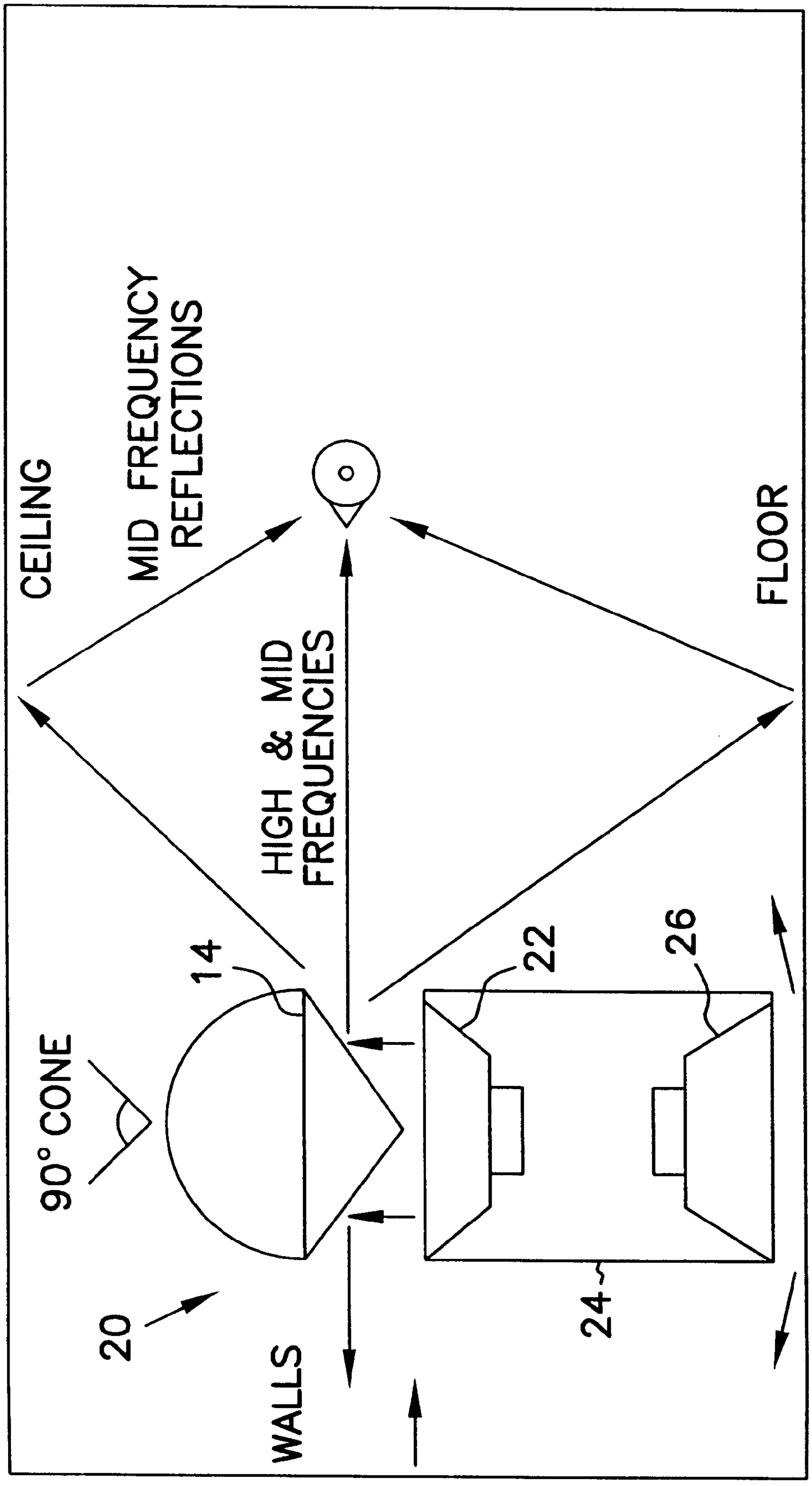
FIG. 3 is a side view of one embodiment of a freestanding cone reflector/coupler speaker system.

Cone reflector/coupler 14 can also be used in a free standing speaker system. One such free standing speaker system 20 is shown in FIG. 3. In speaker system 20 of FIG. 3, cone reflector/coupler 14 is suspended upside down over a speaker driver 22 mounted in cabinet 24. Cabinet 24 also houses a bass speaker 26.

For a large floor standing speaker system such as systems which are commonly used for the front main channels of a stereo or home theater system, cone reflector/coupler 14 could be located at a height of approximately 40 to 48 inches above the floor (approximately at ear level). In one embodiment, cone reflector/coupler 14 has a profile of a single included angle of 90 degrees. Such a profile is used to control floor and ceiling reflections. In this case the cone reflector speaker would not be directly coupling to a surface plane and would suffer diffraction loss but would retain the essential benefits of 360 degree radiation creating large stable images and flat room frequency response.

Geometric Profile of the Table Top/Free Standing Cone Reflector/Coupler

Cone reflector/coupler 14 has a very specific geometric profile used to control directivity and coherence of high frequency sound which directly affects image perception. Examples of some geometric profiles which can be used to advantage in desk top and free standing speaker systems are shown in FIGS. 4–7.

Figure 4A:
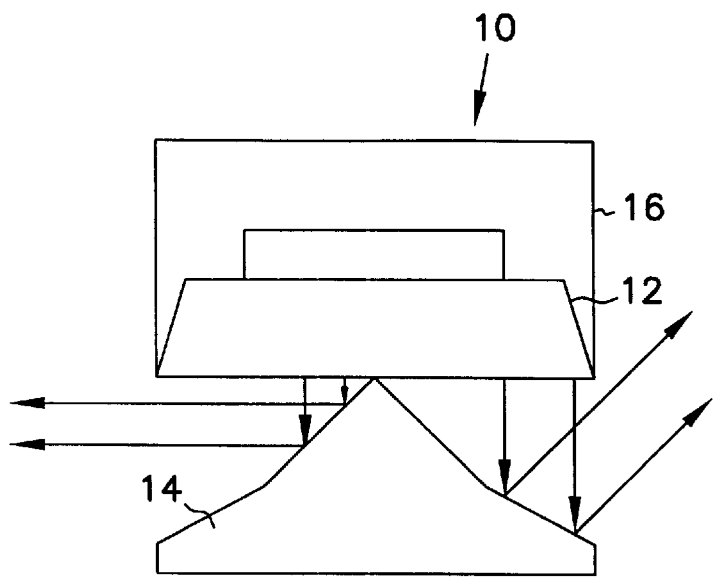
FIGS. 4*a–d* are side views of other embodiments of a cone reflector/coupler that could be used with the speaker systems of FIGS. 1 and 3.

In one embodiment, such as is shown in FIG. 4*a*, cone reflector/coupler 14 has two angle steps. The top part of the cone has a 90 degree included angle and is designed to reflect sounds emanating from the speaker in a direction parallel to the desk top and out toward the walls of the room thereby addressing distant listeners and producing symmetrical room reverberation. The lower part of the cone has an included angle of 135 degrees and is designed to reflect sounds emanating from the speaker up from the desk top at an angle centered around 45 degrees from the horizontal plane to the ears of close field listeners who are above the level of the speakers. The transition point on cone 14 between the 90 and 135 degree included angles is selected so that no sounds are reflected back to the speaker or baffle on the bottom of the cabinet. That is, a line drawn perpendicular to the face of cone 14 should not intersect with cabinet 16 or speaker driver 12.

The surface of cone reflector/coupler 14 must be shaped to prevent reflections back into speaker driver 12 or cabinet 16. The normal listening axis (i.e. the direct path to the listener's ears) falls between parallel to desk top 18 to approximately 45 degrees above desk top 18. Cone reflector/coupler 14 should be designed to concentrate energy between these angles in order to maximize volume and minimize secondary reflections.

Figure 4B:
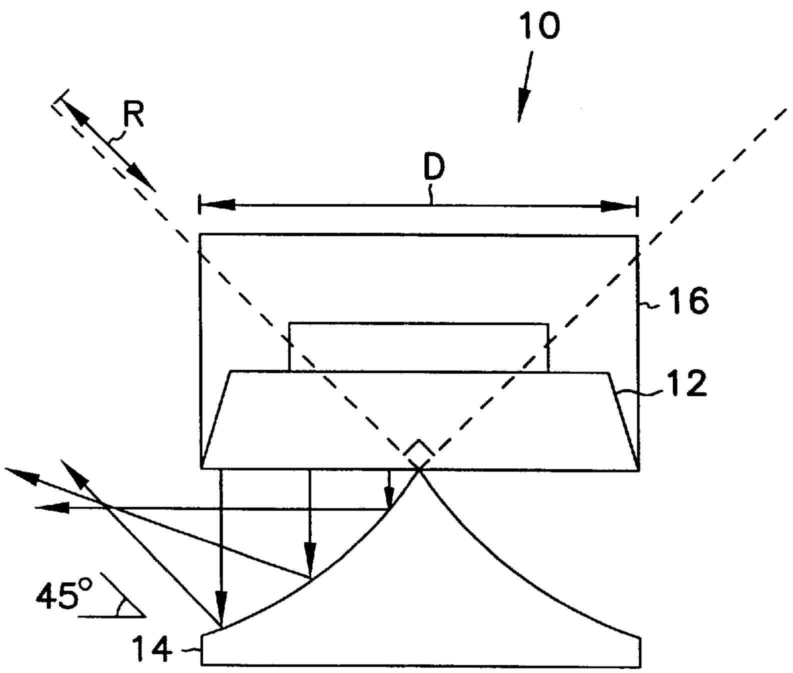
Figure 4C:
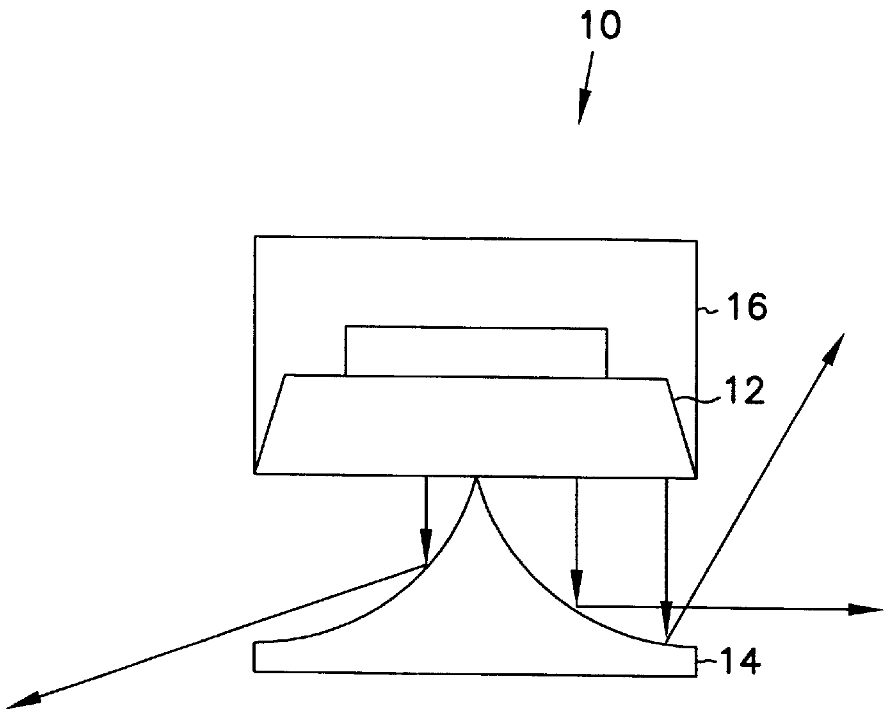
Figure 4D:
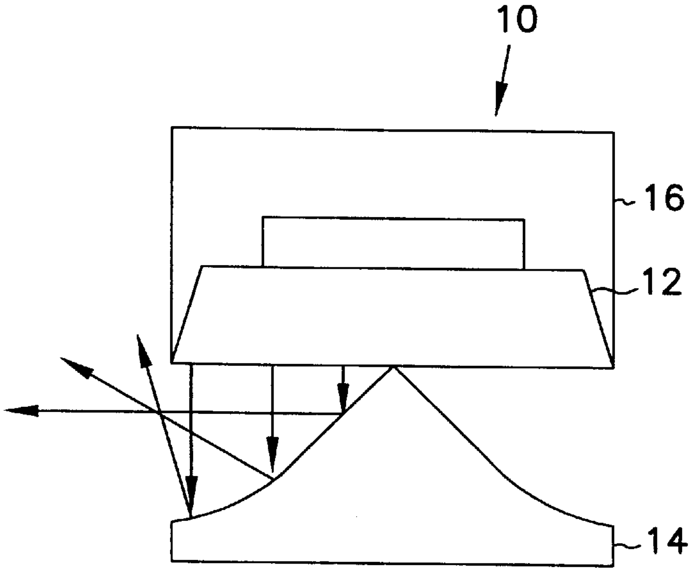

Three other cone reflector/coupler designs are shown in FIGS. 4*b*–4*d*. In the cone reflector/coupler of FIG. 4*b*, the effective included angle varies from 90 to 135 degrees along a continuous curve. In one such embodiment, the curve of cone reflector/coupler 14 is an arc from a circle having a radius R, where R=1.5*D and where D is the width of cabinet 16. Such a design would provide acceptable directivity control over the range of 0 to 45 degrees up from desk top 18.

In contrast, in speaker 10 of FIG. 4*c*, a curve of radius R, where R=D/2, would create a speaker having minimal directivity control.

Finally, as is shown in speaker 10 of FIG. 4*d*, the 135 degree included angle shown in FIG. 4*a* can be replaced with a curved segment which provides an include angle covering 135 to 180 degrees. Such a hybrid cone/curve design would have negative axis directivity control.

In some situations, identical balance in all directions is not a desirable characteristic. For example, a certain amount of directivity may be needed to compensate for acoustic characteristics of a room or to address the particular application.

Figure 5A:
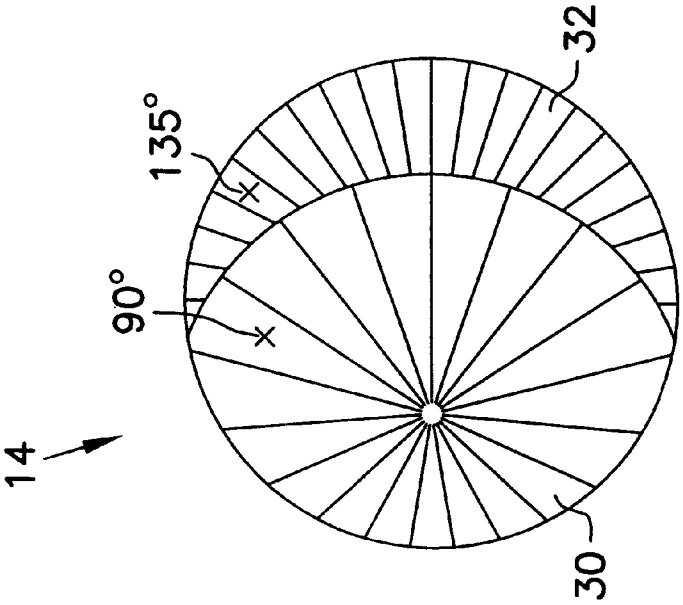
FIGS. 5*a* and 5*b* are top and side views, respectively, of an embodiment of a cone reflector that could be used with the speaker systems of FIGS. 1 and 3 in which the cone reflector has included angles which vary according to the direction the sound will be radiating in the horizontal.
Figure 5B:
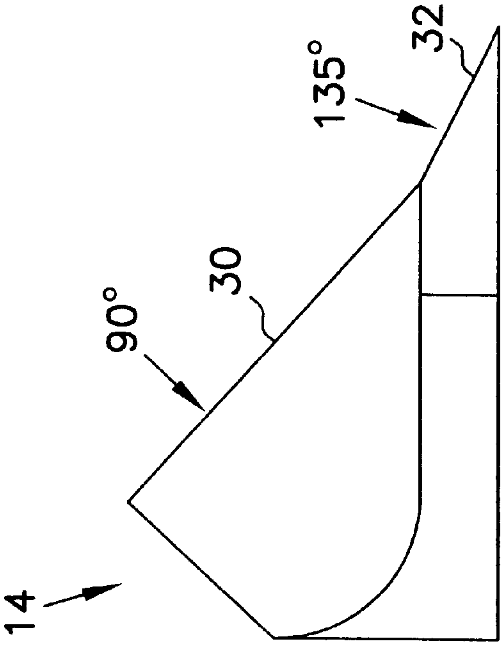

A set of cone reflector/couplers 14 which do not try to maintain identical balance in all directions is shown in FIGS. 5*a*, 5*b*, 6*a*, 6*b*, 7*a* and 7*b*. FIGS. 5*a* and 5*b* show top and side views of a cone reflector/coupler 14 used to direct sound energy in less than a uniform pattern. As can be seen in FIGS. 5*a* and 5*b*, cone reflector/coupler 14 may have an offset point, an included angle 30 of approximately 90 degrees and an included angle 32 of approximately 135 degrees. Cone reflector/coupler 14 as shown would have a vertical dispersion ranging from 0 to 45 degrees and a horizontal dispersion which tends to concentrate most of the energy in a 270 degree arc. Such a cone reflector/couple can be used in either the table top speaker of FIGS. 1 and 2 or in the floor speaker shown in FIG. 3 (if placed upside down).

Figure 6B:
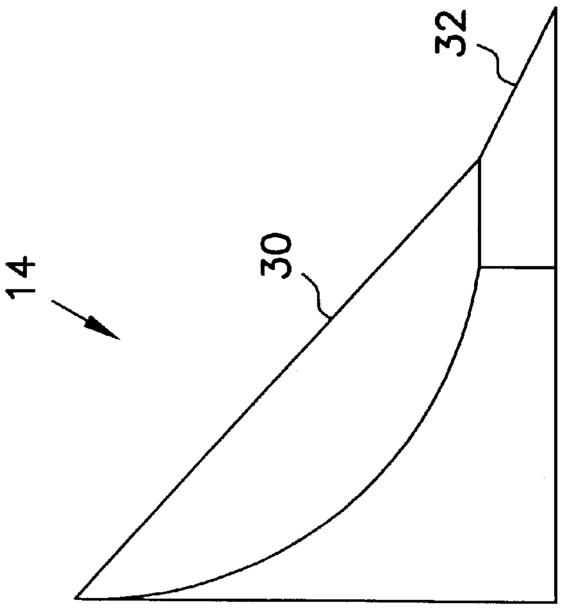
FIGS. 6*a* and 6*b* are top and side views, respectively, of another embodiment of a cone reflector that could be used with the speaker systems of FIGS. 1 and 3.
Figure 6A:
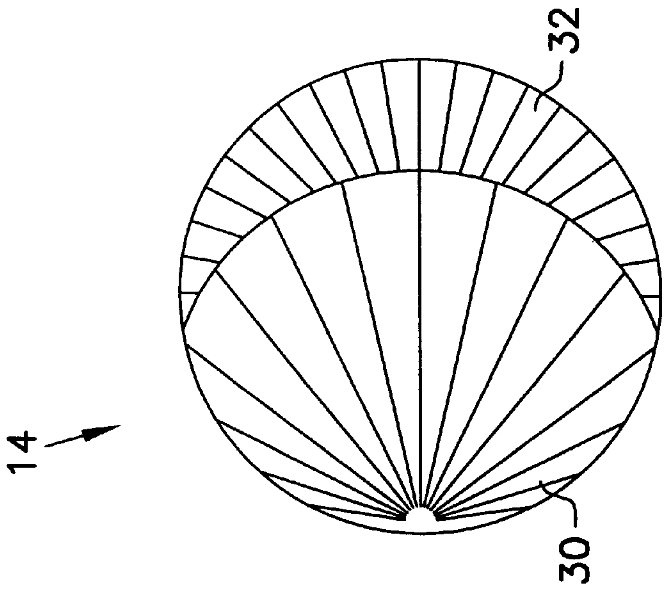

On the other hand, as can be seen in FIGS. 6*a* and 6*b*, cone reflector/coupler 14 may have an offset point and two included angles 30 and 32. In contrast to the cone reflector/coupler shown in FIGS. 5*a* and 5*b*, cone reflector/coupler 14 as shown would have a vertical dispersion ranging from 0 to 45 degrees and a horizontal dispersion which tends to concentrate most of the energy in a 120 degree arc. Such a cone reflector/couple can also be used in either the table top speaker of FIGS. 1 and 2 or in the floor speaker shown in FIG. 3 (if placed upside down).

Figure 7B:
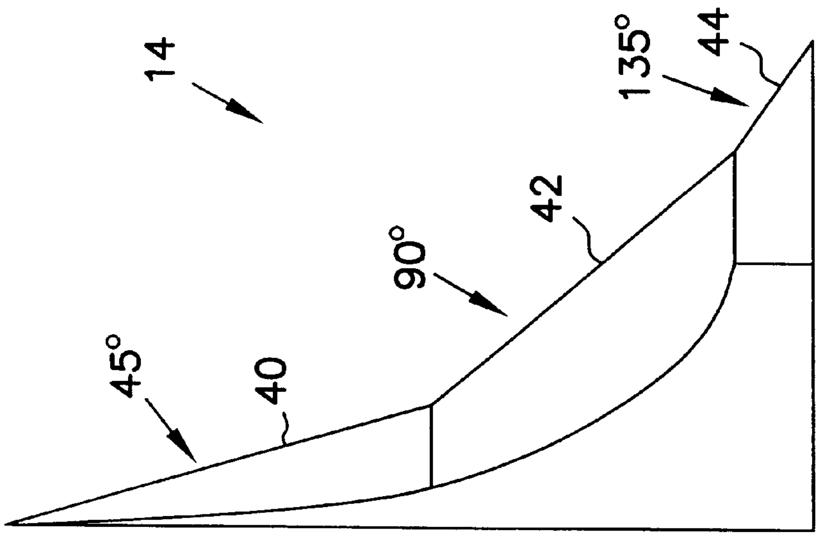
FIGS. 7*a* and 7*b* are top and side views, respectively, of an embodiment of a cone reflector that could be used with the speaker systems of FIGS. 1 and 3 in which the cone reflector has multiple included angles used to disperse sound in a particular pattern from the horizontal plane.
Figure 7A:
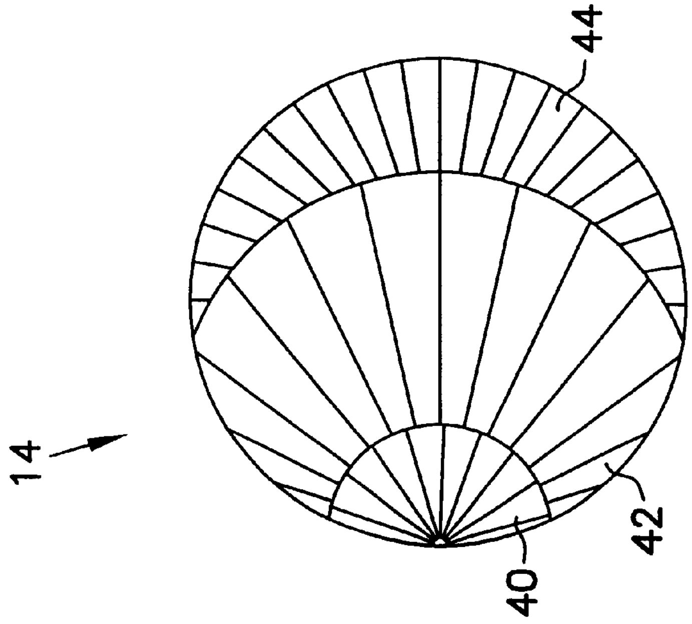

Finally, for large floor speakers such as are shown in FIG. 3, a cone reflector/coupler 14 having three included angles 40, 42 and 44 of approximately 45, 90 and 135 degrees, respectively, can be designed as shown in FIGS. 7*a* and 7*b*. Such a design would disperse sound energy in a vertical range of between ±45 degrees and in a 120 degree horizontal direction.

An example application using asymmetric cones would be for near field monitor speakers on top of a console in a recording studio or near field monitors in a living room. These speakers are typically within 3 feet of the ear and over 6 feet away from the nearest walls. Because the diffuse sound field returning from the walls is low in level relative to the direct on axis sound, different frequency response curves would work best for the direct on axis sound and for the diffuse sound sent to the rest of the room. An asymmetric cone could direct a flat ±1 dB 20 Hz to 20 kHz frequency response to the on axis near field listener and a room dependent frequency response with rolled off high frequencies to the rest of the room. Unlike conventional designs using multiple speakers pointed in various directions the asymmetric cone can transition between the two response curves in a very gradual manner versus direction just like a natural sound source would. With all sound emanating from a single point source speaker driver there are no lobing errors in frequency response versus direction like there are in the conventional multiple driver approach.

It should be apparent that a variety of cone reflector/coupler shapes can be used to address particular acoustical problems. The advantage of using a cone reflector/coupler such as is shown in any of FIGS. 1–7 is that one can handle a variety of problems by first determining the desired acoustical dispersion and then mapping that desired dispersion on the profile used for the cone reflector/coupler. The result is a very adjustable speaker system.

Wall-mounted Speakers

Figure 9:
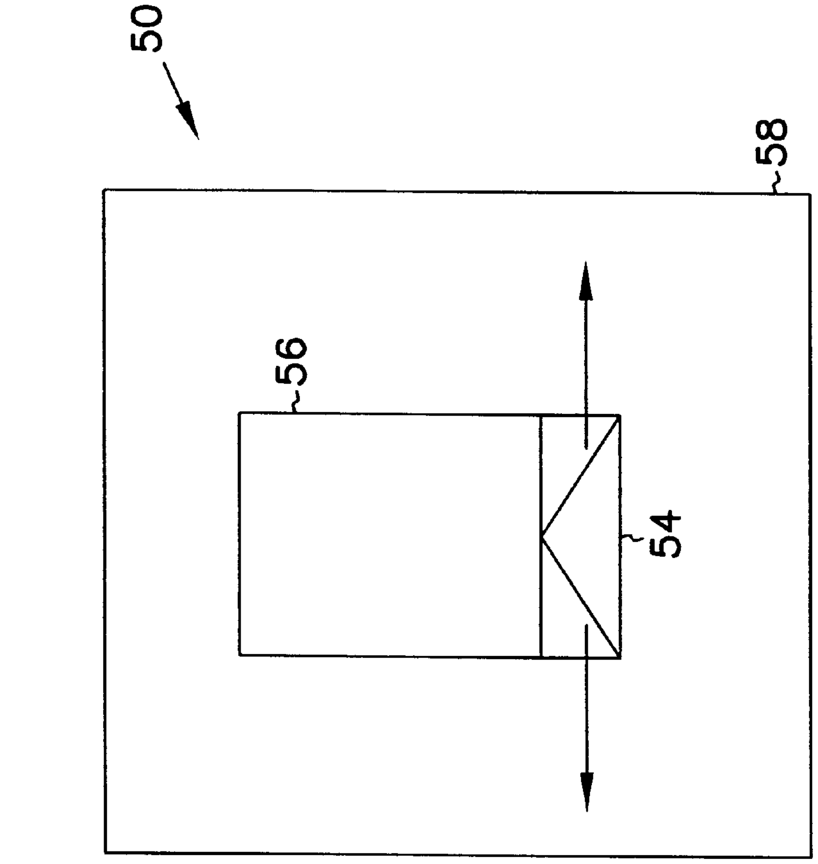
FIG. 9 is a front view of an embodiment of the wall-mounted cone reflector coupler speaker system.
Figure 8:
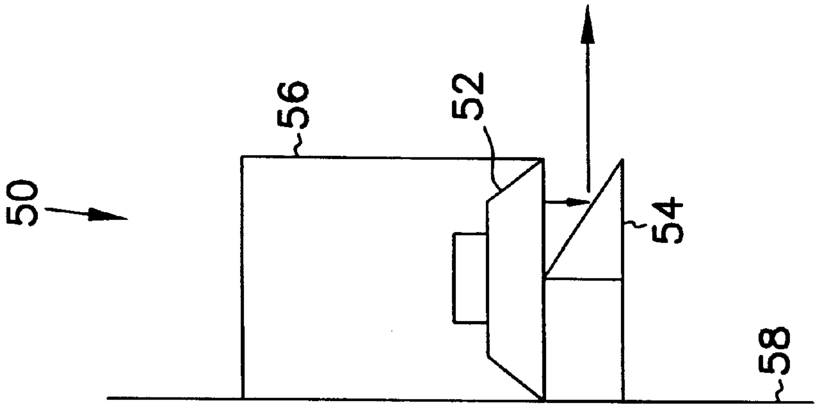
FIG. 8 is a side view of an embodiment of a wall-mounted cone reflector/coupler speaker system.

Cone reflector/couplers can also be used to advantage on wall-mounted speakers. A representative wall-mounted speaker 50 is shown side and front views, respectively, in FIGS. 8 and 9. Speaker 50 includes a speaker driver 52, a cone reflector/coupler 54 and a cabinet 56. Speaker driver 52 is mounted in cabinet 56; cabinet 56 is then mechanically connected to cone reflector/coupler 54 such that sound waves generated by speaker driver 52 are reflected off of cone reflector/coupler 54.

Geometric Profile of the Wall-mounted Cone Reflector/Coupler

Figure 10B:
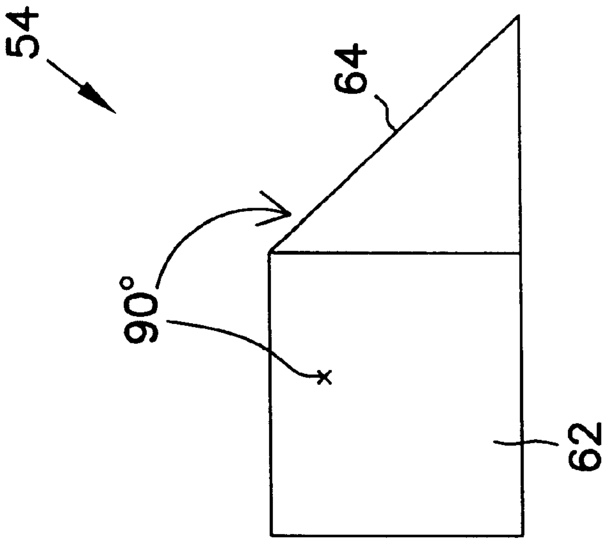
FIGS. 10*a* and 10*b* are top and side views, respectively, of an embodiment of a cone reflector that could be used with the speaker systems of FIGS. 8 and 9 in which the cone reflector has included angles which vary according to the direction the sound will be radiating in the horizontal.
Figure 10A:
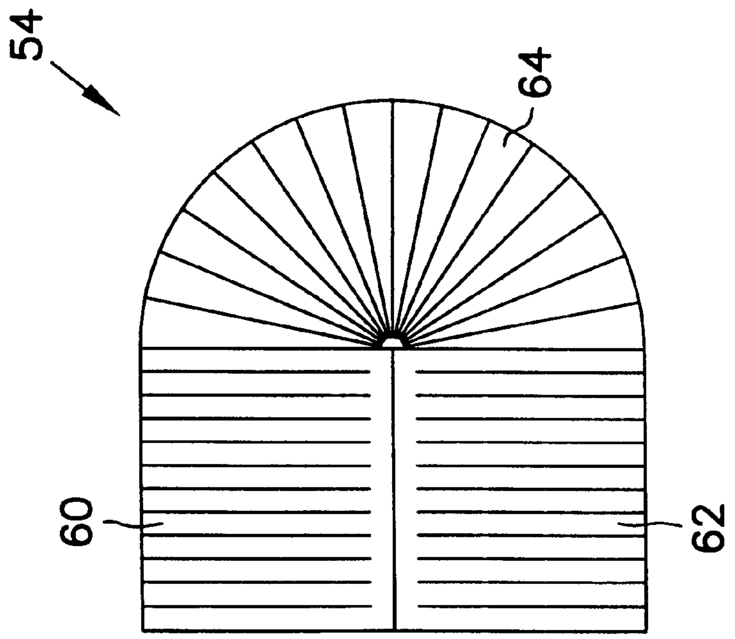

For coupling to a vertical surface plane such as a wall cone reflector/coupler 54 would be rotated 90 degrees to the surface (still perpendicular to the face of the speaker driver), aligned parallel to the floor, and would be a modified hemi cone. One such hemi cone design is shown in FIGS. 10 and 10*b*. When placed at an optimum height of 40 to 48 inches above the floor (locating the speakers at ear level) the cone profile in such an embodiment would have a single included angle of 90 degrees. Such a cone profile would have 90 degree sides 60 and 62 connected to a half cone 64. Half cone 64 also has an included angle of 90 degrees. The cone profile shown in FIGS. 10*a* and 10*b* is unique in that it is designed to have identical frequency balance and volume over the 180 degree hemisphere of the wall plane and eliminate near field reflections. This radiation pattern would be a significant improvement over conventional in wall speakers that suffer from directivity changes with frequency. In addition, cone reflector/coupler 54 of FIGS. 10*a* and 10*b* provides a vertical dispersion of ±20 degrees.

Figure 11B:
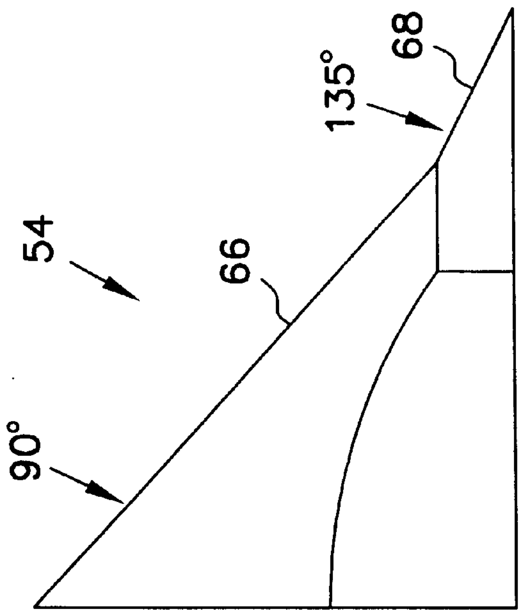
FIGS. 11*a* and 11*b* are top and side views, respectively, of another embodiment of a cone reflector that could be used with the speaker systems of FIGS. 8 and 9.
Figure 11A:
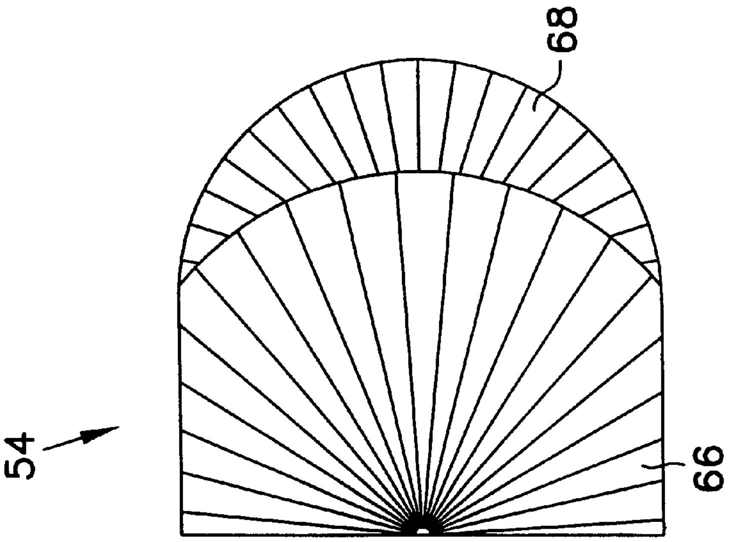

An alternate embodiment of a cone reflector/coupler 54 which can be used in speaker 50 is shown in FIGS. 11*a* and 11*b*. In FIG. 11*a*, the 90 degree sides of FIG. 10*a* have been replaced with a truncated 90 degree included angle cone 66. That cone gives way to a 135 degree included angle cone 68 at the point where reflections from cone 54 clear cabinet 56. The cone reflector/coupler of FIGS. 11*a* and 11*b* provide a horizontal dispersion of 120 degrees and a vertical dispersion of between −20 and +45 degrees.

Figure 12B:
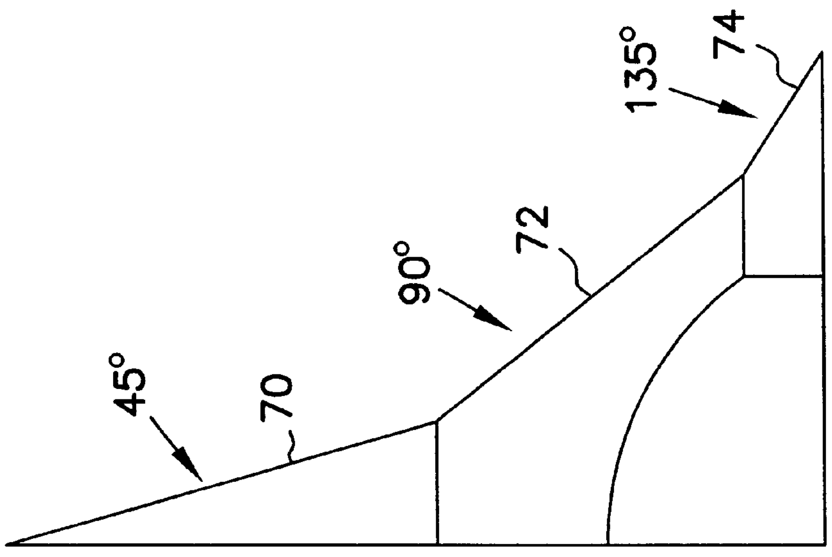
FIGS. 12*a* and 12*b* are top and side views, respectively, of an embodiment of a cone reflector that could be used with the speaker systems of FIGS. 8 and 9 in which the cone reflector has multiple included angles used to disperse sound in a particular pattern from the horizontal plane.
Figure 12A:
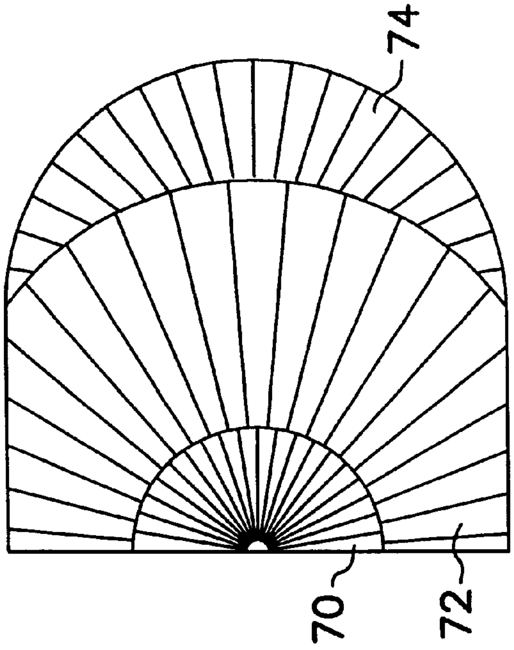

Yet another embodiment of a cone reflector/coupler 54 which can be used in speaker 50 is shown in FIGS. 12*a* and 12*b*. In FIG. 12*a*, the 90 degree included angle cone 66 of FIGS. 11*a* and 11*b* have been replaced with a 45 degree included angle cone 70 connected to a truncated 90 degree included angle cone 72. Cone 72 gives way to a 135 degree included angle cone 74 at the point where reflections from cone 54 clear cabinet 56. The cone reflector/coupler of FIGS. 12*a* and 12*b* provide a horizontal dispersion of 120 degrees and a vertical dispersion of between −45 and +45 degrees.

An ideal application of the 180 degree radiation pattern generated with cone reflector/coupler 54 of FIGS. 10*a* and 10*b* would be for the rear speakers of a Dolby or THX theater system for professional theaters or home theaters. The THX home theater requirements specify Bi-Polar speakers for the rear surround channels "to maximize sound dispersion and distant secondary reflections in order to mask the location of the speakers". The wall mounted cone reflector/coupler 180 degree radiation pattern has superior directivity to a Bi-Polar speaker and would fully realize the THX design goal objectives.

Other Embodiments

Figure 13:
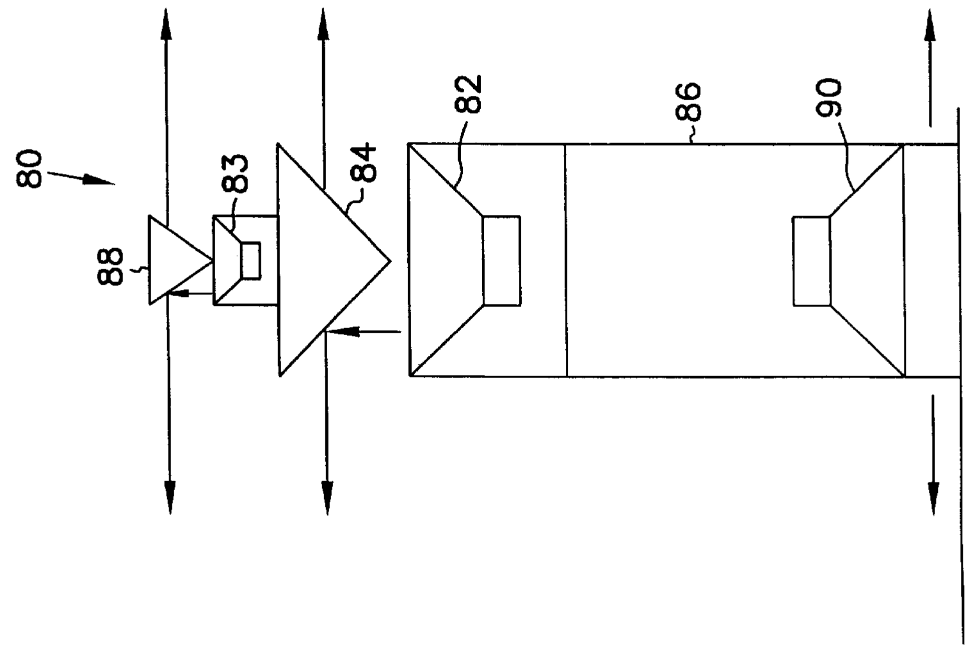
FIG. 13 is a side view of a second embodiment of a free-standing cone reflector/coupler speaker system.
Figure 14:
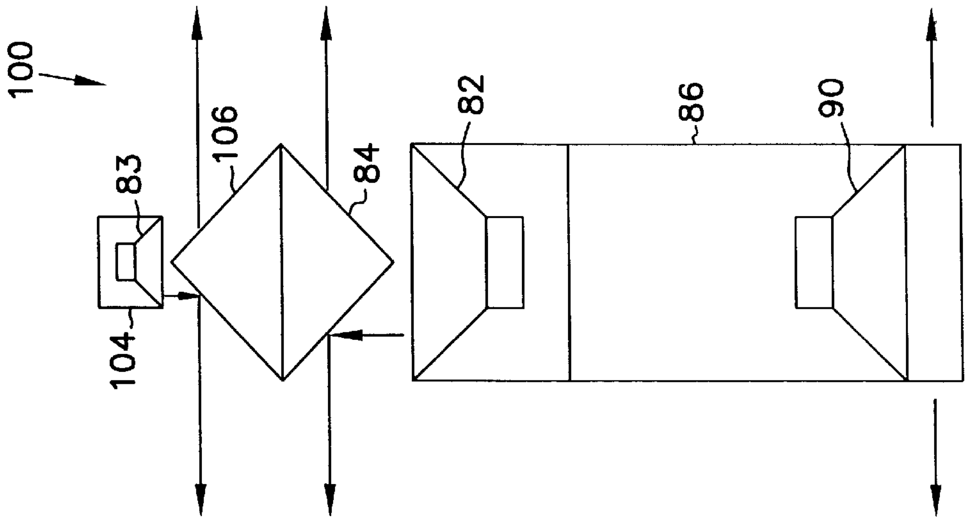
FIG. 14 is a side view of yet another embodiment of a free-standing cone reflector/coupler speaker system.

Two additional embodiments of the free standing speaker system shown in FIG. 3 can be seen in FIGS. 13 and 14. In contrast to the mid/high-range speaker driver used as driver 22 in FIG. 3, however, the speaker systems illustrated in FIGS. 13 and 14 have separate mid and high-range speaker drivers acoustically coupled to separate cone reflectors. In speaker system 80 of FIG. 13, for example, cone reflector/coupler 84 is suspended upside down over a mid-range speaker driver 82 mounted in cabinet 86. In addition, an additional cone reflector/coupler 88 is suspended upside down over a high-range speaker driver 83 mounted on the base of cone reflector/coupler 84. Cabinet 86 also houses a bass speaker 90 directed toward the floor. In one embodiment, cone reflector/couplers 84 and 88 are aligned on a common axis.

In speaker system 100 of FIG. 14, high-range speaker driver 83 is mounted in an enclosure 104 and the enclosure is then suspended upside down over a cone reflector/coupler 106. Cone reflector/coupler 106 is then mounted on the base of cone reflector/coupler 84. In one embodiment, cone reflector/couplers 84 and 106 are aligned on a common axis.

While a speaker system such as systems 80 and 100 can be constructed using a multiple separate drivers 82 and 83 as is shown in FIGS. 13 and 14, the designer must pay careful attention to the problem of vertical lobing error which will exist at the crossover frequency.

Figure 15A:
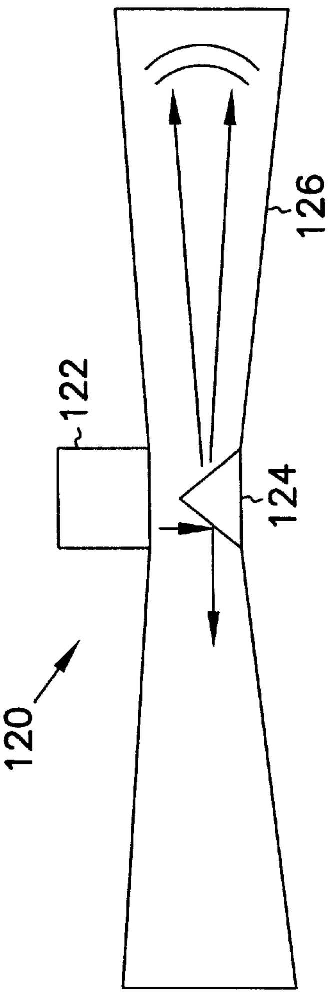
FIGS. 15*a* and 15*b* are side and top views, respectively, of an embodiment of a horn-based reflector/coupler speaker system.
Figure 15B:
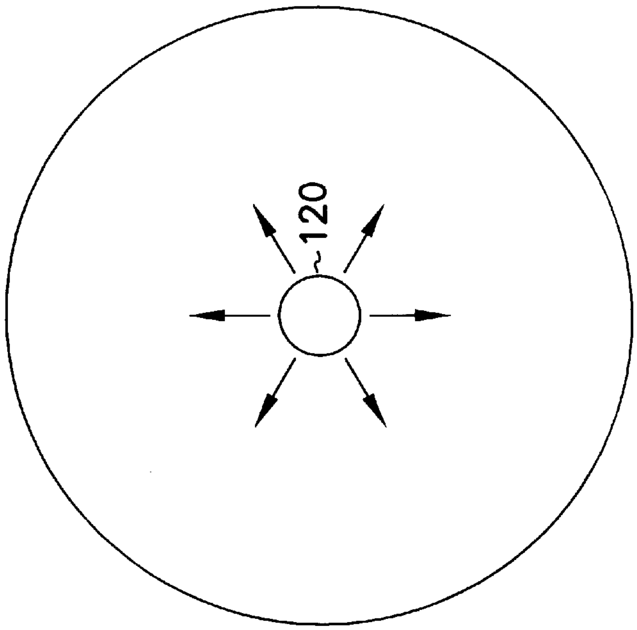

To take advantage of high efficiency compression drivers, the reflector cone and bottom of the enclosure can be profiled at a suitable horn expansion rate such as conical or constant directivity. One embodiment of such a cone reflector/coupler speaker system is shown in FIGS. 15*a* and 15*b*. In speaker 120 of FIGS. 15*a* and 15*b* a compression driver 122 directs sound toward a cone reflector/coupler 124 mounted within a horn 126. In one embodiment cone reflector 124 has an included angle of 90 degrees used to rotate the output of compression driver 122 90 degrees in order to couple the sound to the horn. Other reflector included angles could be used if the sound is to be directed in other than a radial plane, such as at the ground when the system is mounted high on a pole. An example is given in FIGS. 15*a* and 15*b* for a large public address horn with a 360 degree radiation pattern. Other patterns could be used based on the dispersion pattern desired. In addition, the horn profile used for horn 126 could be exponential, conical or constant directivity. Both compression driver 122 and horn 126 would be sized for the necessary volume level and frequency coverage. For example, a 300 Hertz horn for public address use would be approximately nine feet in diameter.

Figure 16A:
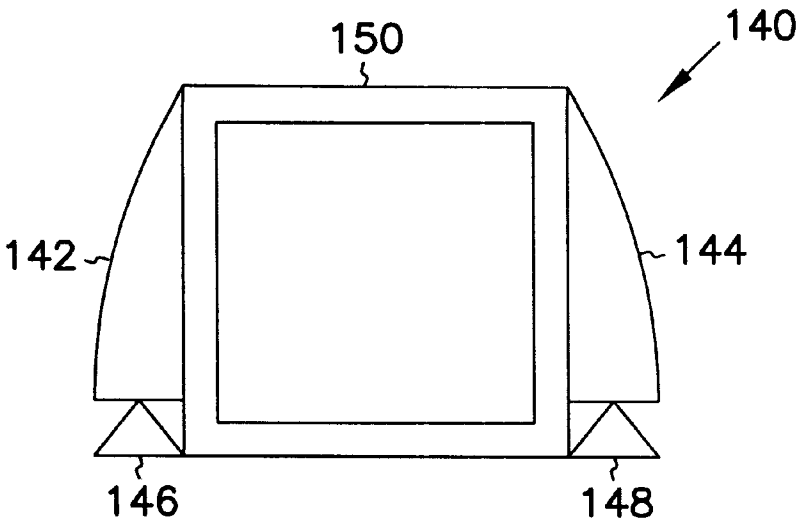
FIGS. 16*a* and 16*b* are front and top views, respectively, of an embodiment of a television cabinet-mounted reflector/coupler speaker system.
Figure 16B:
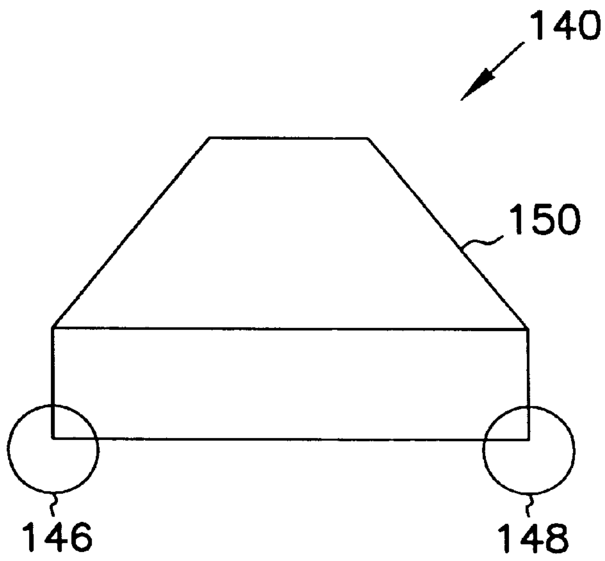

Yet another embodiment of a cone reflector/coupler speaker system is shown in FIGS. 16*a* and 16*b*, which shows front and top views, respectively, of an embodiment of a television cabinet-mounted cone reflector/coupler speaker system. In speaker 140 of FIGS. 16*a* and 16*b* speaker drivers 142 and 144 direct sound toward cone reflector/couplers 146 and 148, respectively. Speaker drivers 142 and 144 are attached to the corners of television cabinet 150 as can be seen in the top view in FIG. 16*b*. In one embodiment television cabinet 150 is placed on a table and cone reflector/couplers 146 and 148 are used to coupled sound from drivers 142 and 144 to the table. As in the table-top speaker systems discussed previously a wide variety of cone profiles can be used to obtain the desired dispersion. In one embodiment cone reflector/couplers 146 and 148 are 270 degree profile reflectors similar to the profiles shown in FIGS. 7*a* and 7*b*. Such an embodiment would have a sound similar to surround sound but without the extra speakers needed for surround sound. Sound quality could, however, be further enhanced through the use of additional speakers.

Frequency Response for Cone Reflector/Coupler Speaker Designs

The 360 degree radiation pattern of the cone reflector speaker requires a different frequency response balance than that used for conventional speakers. In addition to the direct sound, the 360 degree radiation pattern fills a room with diffuse sounds coming from all directions. The acoustic energy that the ear receives is similar to what is experienced in large auditorium-like concert halls. To get a "perceived" flat frequency response an equalization curve similar to that used in large auditoria with conventional speakers is required for the 360 degree radiation speakers even in small rooms. Most speakers have the majority of their radiated energy concentrated in their frontal axis, with considerably less energy radiated to the sides and rear. For conventional types of speakers the best sound in the near field (where direct sound dominates over reverberant sound) is generally accepted to be when the frequency response measures flat ±1 dB from 20 Hz to 20 kHz. However, in the far field where the sound is more dominated by reverberation a different frequency response equalization curve is required. Psychoacoustic research has confirmed the "house curve" that has been used since the 1930's in large auditorium-like movie theaters and concert halls. The "house curve" is a 4 dB to 6 dB per octave roll off of the high frequencies beginning in the neighborhood of 7000 Hz. Dolby also specifies this rolled off high frequency curve in the rear channels of home theater systems for the same reasons. To the ear this rolled off response in the far or reverberant field sounds "flat". This is due to the fact that up close to the speakers most of the sound is received from the front of the ears but in the far field the sound is integrated from all directions by the ear and the pinna or outer ear modifies what was a flat frequency to now sound like there is too much high frequency. This is a side effect of the pinna's natural function of modifying frequency verses direction to help determine sound source location.

For the above mentioned reasons in one embodiment the cone reflector speaker has a rolled off measured high frequency response curve in order to provide a "perceived" flat frequency by the ear. Each cone profile needs a different high frequency response curve dependant upon the degrees of radiation that it covers. The high frequency equalization can be provided for in the design of the speaker driver or in an acoustic filter, a passive filter, or an electronic active filter. In one embodiment a high frequency "tone control" with a curve similar to the "house curve" is provided so that minor adjustments can be made to the in room frequency balance to accommodate differing room acoustics.

A Design Example

An example of the steps taken in designing a free standing speaker system 20 such as is shown in FIG. 3 is described next. For a cylindrical speaker of 13 inches diameter the diffraction loss would begin at 521 Hertz and reach minus 6 dB at 260 Hertz. A frequency response graph showing the effects of diffraction loss is shown in FIG. 17. The diffraction loss can be compensated for by including equalization in the crossover or boost in an electronic crossover.

In speaker system 20 of FIG. 3, a cone reflector having a single included angle of approximately 90 degrees is adequate for obtaining uniform dispersion in the horizontal plane. The reflector cone should be made of a nonresonant, smooth, hard and rigid material. The ideal choice would be a solid formed of rock or metal with added damping treatment. In practice much less strength is necessary. After evaluating the frequency range covered, the necessary volume level and size of the cone, minimum mass and stiffness can be determined for the cone. As an example, for a three inch diameter cone of the profile shown in FIG. 4*a* to be used over the frequency range of 100 Hz to 20 kHz with an average sound pressure level of 110 decibel, acceptable performance can be provided from a cone formed of high impact polystyrene (HIPS) with a 0.125 inch wall thickness. The minimum reflector cone size should be no less than the width of the enclosure surrounding speaker driver 12 to prevent internal reflections. However, the cone can be much larger than the enclosure to extend pattern control to lower frequencies.

A reflector cone such as is shown in any of the Figures above can be used with any type of speaker driver. In addition to the conventional electrodynamic cones, piezoelectric, electrostatic, planar magnetic, ribbon, inductive coupled and magnetostrictive speaker drivers can be used. The speaker should radiate as a point source for best results. If a multiple driver approach is used, best results are obtained from a coincident design. If a coaxial driver is used electrical delay should be added to correct for driver offset.

Once the cone reflector profile design is set other room modes must be analyzed for inclusion in the final equalization curve. For example, there are reflections off the floor and ceiling that partially compensate for the diffraction loss. In the example shown in FIG. 14, system 20 has a cone height of 48 inches, a ceiling height of 96 inches, a listening height of 48 inches and a listening distance of 96 inches. The path length difference is 39.76 inches or 2902 micro seconds. This corresponds to a one wave length time delay of 341 Hertz where there could be as much as 6 dB of room acoustical boost to offset the 6 dB of diffraction loss. As is shown in FIG. 18, there will also be an additional 6 dB of depression at the one half wavelength frequency of 170 Hertz resulting in total losses of up to 12 decibel around this frequency. In order to avoid this depression frequency the cone reflector speaker should crossover at around 250 to 300 Hertz to a bass speaker mounted facing the floor. The combined room response of diffraction loss and reflections is shown in FIG. 19.

In contrast to speaker driver 22, bass speaker 26 maintains the 360 degree radiation pattern and is coupled to the floor plane. It thus would not have a frequency depression problem near the crossover. In fact a properly designed bass speaker 26 would take advantage of the room's 12 decibel per octave rising response (that begins around 30 Hertz for the average living room). As shown in FIG. 20, this room acoustical gain reaches a maximum of 15 decibel at 10 hertz. If the woofer was designed as a second order closed box (12 dB per octave rolloff) with a system Q of 0.707 and a minus 3 decibel frequency of 30 Hertz as is shown in FIG. 21, the room rise would equalize its response flat to 10 Hertz, and there are several music recordings available that go this low. Such a frequency response is shown in FIG. 22, which is the summed response of the graphs shown in FIGS. 17, 18, 20 and 21. This system design provides identical frequency balance and volume in all directions of the horizontal plane, making it the ultimate speaker for a true-to-life "you are there" experience.

Although the present invention has been described with reference to the preferred embodiments, those skilled in the art will recognize that changes may be made in form and detail without departing from the spirit and scope of the invention.

What is claimed is:

1. A cone reflector/coupler speaker system having reduced diffraction loss, the system comprising:

a speaker driver having an output surface; and a cone reflector, said cone reflector having a top, a base and first and second included angles, wherein said top is placed adjacent to said output surface of said speaker driver, wherein the first included angle extends from the top of the cone reflector to a transition point and is selected to reflect sound generated by said speaker driver within a plane approximately parallel to said base, wherein the second included angle extends downward from the transition point, and wherein the base is oriented to the speaker driver such that when the speaker system is placed on a coupling surface the coupling surface acts as an extension of the cone reflector, thereby reducing diffraction loss, wherein the transition point minimizes reflection of sound waves back into said speaker driver.

2. The cone reflector/coupler speaker system as described in claim 1 wherein said first included angle is approximately 90 degrees and said second included angle is approximately 135 degrees.

3. A cone reflector/coupler speaker system having reduced diffraction loss, the system comprising:

a speaker driver having at a output surface;

a cone reflector, said cone reflector having a top, a base and an included angle, wherein said top is placed adjacent to said output surface of said speaker driver, wherein the included angle is selected to reflect sound generated by said speaker driver within a plane approximately parallel to said base and wherein the base is oriented to the speaker driver such that when the speaker system is placed on a coupling surface the coupling surface acts as an extension of the cone reflector, thereby reducing diffraction loss; and an electronic crossover network for attenuating frequencies as a function of coupling to the coupling surface.

4. The cone reflector/coupler speaker system as described in claim 3 wherein said included angle is 90 degrees.

5. The cone reflector/coupler speaker system as described in claim 3 wherein said cone reflector further includes a curved surface extending below said first included angle.

6. A cone reflector/coupler speaker system comprising:

a speaker driver having at least one output surface; and a hemi-cone reflector having first and second surfaces, wherein the first surface is an approximately conical shape having an apex located adjacent to said output surface of said speaker driver;

wherein said conical shape comprises a first included angle used to direct sound waves in a desired direction;

wherein the second surface is designed to be placed in proximity to a flat surface so that sound from the speaker driver can be coupled to the flat surface; and wherein the speaker driver includes an electronic crossover network which attenuates frequencies as a function of coupling of sound from the speaker driver to the flat surface.

7. The cone reflector/coupler speaker system as described in claim 6 wherein said first included angle is approximately 90 degrees.

8. A cone reflector for use in reflecting sound waves generated by a speaker driver, comprising:

a conical shape having an apex, a base, a first included angle and a second included angle;

wherein the first included angle reflects a substantial portion of sound waves impinging on said cone reflector in a plane parallel to the base of the conical shape;

wherein the second included angle reflects a substantial portion of sound waves impinging on said cone reflector directly toward a listener's ear; and wherein said first and second included angles meet at a transition point which minimizes sound energy reflected from the included angles back to the speaker driver.

9. The cone reflector as described in claim 8 wherein said first included angle is approximately 90 degrees and wherein said second included angle is approximately 135 degrees.

10. A method of reducing diffraction loss in a speaker having a speaker driver mounted in a speaker cabinet, wherein the speaker driver has an output surface, the method comprising the steps of: forming a cone reflector having a cone reflector profile, wherein the cone reflector includes a bottom surface;

mounting the cone reflector opposite the speaker driver;

placing the bottom surface of the cone reflector in contact with a substantially flat surface;

generating sound waves at the speaker driver; and reflecting the sound waves generated by the speaker driver from the cone reflector such that the sound waves are coupled to the substantially flat surface;

wherein the step of generating sound waves at the speaker driver includes the step of attenuating frequencies within the sound waves as a function of the surface to which the sound waves are to be coupled.

11. The method of reducing diffraction loss according to claim 10, wherein the step of forming a cone reflector includes the step of shaping the cone reflector to include first and second cone sections, wherein the first cone section is a portion of a right angle cone having a first included angle and the second cone section is a portion of a right angle cone having a second included angle; and wherein the step of reflecting includes the steps of:

reflecting the sound waves from the first cone section in a direction approximately parallel to a horizontal plane; and reflecting the sound waves from the second cone section in a direction parallel to a plane which intersects the horizontal plane.

12. The method of reducing diffraction loss according to claim 10, wherein the step of generating sound waves at the speaker driver includes the step of attenuating frequencies within the sound waves to achieve a perceived flat frequency response.

13. The method of reducing diffraction loss according to claim 10, wherein the step of forming a cone reflector includes the step of shaping the cone reflector to include first and second cone sections, wherein the first cone section is a portion of a right angle cone having a first included angle and the second cone section is a portion of a right angle cone having a second included angle; and wherein the method further comprises:

reflecting the sound waves from the first cone section in a direction approximately parallel to a horizontal plane; and reflecting the sound waves from the second cone section in a direction parallel to a plane which intersects the horizontal plane.

14. A table top speaker system comprising first and second satellite speakers, wherein each of the first and second satellite speakers includes a speaker driver and a cone reflector, wherein the cone reflector reflects sound waves generated by the speaker driver in a radiation pattern such that, when the satellite speakers rest on a substantially flat surface, reflections from the substantially flat surface are reduced and the reflected sound waves couple to the substantially flat surface;

wherein the table top speaker system further comprises a subwoofer and equalization circuitry for attenuating frequencies produced by the first and second satellite speakers and the subwoofer as a function of a crossover frequency, wherein the crossover frequency is a function of a dimension of the substantially flat surface.

15. The speaker system according to claim 14, wherein the satellite speakers include means for rolling off high frequencies as a function of the radiation pattern of the satellite speakers.

16. In a speaker system having a first and a second speaker driver, wherein the output of the first speaker driver and the second speaker driver cover first and second frequency ranges, respectively, wherein the first frequency range starts at a higher frequency than the second speaker driver, a method of equalizing sound generated by the first and second drivers, the method comprising the steps of:

forming a cone reflector having a cone reflector profile, wherein the cone reflector includes a bottom surface;

mounting the come reflector opposite the first speaker driver;

placing the bottom surface of the cone reflector in contact with a substantially flat surface such that sound waves reflected by the cone reflector are coupled to the substantially flat surface;

generating sound waves at the first and second speaker drivers, wherein the step of generating sound waves at the first and second speaker drivers includes the step of equalizing frequencies within the sound waves generated by the first and second speaker drivers as a function of the coupling of the sound waves generated by the first speaker driver to the substantially flat surface.

17. The method of reducing diffraction loss according to claim 16, wherein the step of forming a cone reflector includes the step of shaping the cone reflector to include first and second cone sections, wherein the first cone section is a portion of a right angle cone having a first included angle and the second cone section is a portion of a right angle cone having a second included angle;

wherein the method further comprises the steps of:

reflecting the sound waves from the first cone section in a direction approximately parallel to a horizontal plane; and reflecting the sound waves from the second cone section in a direction parallel to a plane which intersects the horizontal plane.

18. In a speaker system having a speaker driver, a method of attenuating frequencies, the method comprising the steps of:

forming a cone reflector having a cone reflector profile, wherein the cone reflector reflects sound generated by the speaker driver into a radiation pattern;

mounting the cone reflector opposite the speaker driver;

generating sound waves at the speaker driver, wherein the step of generating sound waves includes rolling off high frequencies as a function of the radiation pattern of the satellite speakers and attenuating certain frequencies as a function of an expected coupling of sound waves reflected from the cone reflector to an adjacent surface.

19. The method according to claim 18, wherein the step of rolling off includes the step of attenuating frequencies beginning at approximately 7000 Hz at a rate of approximately 4 to 6 dB per octave to produce a perceived flat response in a speaker having a 360 degree radiation pattern.

* * * * *